United States Patent
Imhof et al.

(10) Patent No.: US 12,242,141 B2
(45) Date of Patent: Mar. 4, 2025

(54) ATOMIC OPTICAL REFERENCE SYSTEM

(71) Applicants: Eric A. Imhof, Albuquerque, NM (US); Steven Ryan Jefferts, Chatsworth, CA (US); Vyacheslav Lebedev, Redondo Beach, CA (US)

(72) Inventors: Eric A. Imhof, Albuquerque, NM (US); Steven Ryan Jefferts, Chatsworth, CA (US); Vyacheslav Lebedev, Redondo Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 52 days.

(21) Appl. No.: 18/297,886

(22) Filed: Apr. 10, 2023

(65) Prior Publication Data
US 2023/0333415 A1    Oct. 19, 2023

Related U.S. Application Data

(60) Provisional application No. 63/332,095, filed on Apr. 18, 2022.

(51) Int. Cl.
*G04F 5/14*    (2006.01)
*G02F 1/01*    (2006.01)
(Continued)

(52) U.S. Cl.
CPC ............. *G02F 1/0121* (2013.01); *G04F 5/14* (2013.01); *G05D 25/02* (2013.01); *H03L 7/26* (2013.01); *G02F 2201/58* (2013.01)

(58) Field of Classification Search
CPC ...... G02F 1/0121; G02F 2201/58; G04F 5/14; G04F 5/145; G05D 25/02; H03B 17/00; H03L 7/26
See application file for complete search history.

(56) References Cited

U.S. PATENT DOCUMENTS

| | | | |
|---|---|---|---|
| 6,363,091 B1 * | 3/2002 | Zhu ......................... | G04F 5/145 372/98 |
| 9,905,999 B2 * | 2/2018 | Li ........................... | H01S 5/0687 |

(Continued)

OTHER PUBLICATIONS

International Search Report and Written Opinion for corresponding PCT/US2023/018050, mailed Aug. 1, 2023, pp. 1-9.

*Primary Examiner* — Levi Gannon
(74) *Attorney, Agent, or Firm* — Tarolli, Sundheim, Covell & Tummino LLP

(57) ABSTRACT

One example includes an atomic optical reference system. The system includes an optical system comprising a laser configured to generate an optical beam. The system also includes a vapor cell comprising alkali metal atoms that are stimulated in response to a modulated beam corresponding to an amplitude-modulated version of the optical beam. The system also includes a detection system configured to monitor at least one detection signal corresponding to light emitted from or absorbed by the vapor cell and to generate at least one feedback signal in response to the at least one detection signal. The system further includes a beam modulator configured to amplitude-modulate the optical beam to generate the modulated beam and to frequency shift the optical beam to generate an output beam having a stable frequency in response to the at least one feedback signal.

20 Claims, 3 Drawing Sheets

(51) Int. Cl.
*G05D 25/02* (2006.01)
*H03L 7/26* (2006.01)

(56) References Cited

U.S. PATENT DOCUMENTS

| | | |
|---|---|---|
| 10,340,658 B1 | 7/2019 | Boyd et al. |
| 10,353,270 B2* | 7/2019 | Perrella ................. H01S 3/0085 |
| 10,684,591 B1 | 6/2020 | Burke et al. |
| 10,965,298 B2 | 3/2021 | Gerginov |
| 2008/0042761 A1 | 2/2008 | Happer et al. |
| 2010/0315642 A1* | 12/2010 | Chow .................... G01N 21/39 |
| | | 356/432 |
| 2013/0003766 A1 | 1/2013 | Savchenkov et al. |
| 2014/0028405 A1* | 1/2014 | Hong ...................... G04F 5/145 |
| | | 331/94.1 |
| 2015/0236784 A1* | 8/2015 | Vahala ................... H03B 17/00 |
| | | 398/115 |
| 2020/0117146 A1 | 4/2020 | Larsen et al. |
| 2022/0155730 A1* | 5/2022 | Ye .......................... H01L 27/15 |
| 2023/0030450 A1* | 2/2023 | Matsumoto ............. G04F 5/145 |

\* cited by examiner

ATOMIC OPTICAL REFERENCE SYSTEM

CROSS REFERENCE TO RELATED APPLICATION

This application claims priority from U.S. Provisional Patent Application No. 63/332,095, filed 18 Apr. 2022, which is incorporated herein by reference in its entirety.

TECHNICAL FIELD

The present invention relates generally to atomic systems, and specifically to an atomic optical reference system.

BACKGROUND

Atomic systems that implement atomic interaction with optical beams are implemented for a variety of applications, such as sensors and atomic clocks. As an example, one or more optical beams can be provided through a vapor cell that includes an alkali metal vapor, such that excitation of the alkali metal vapor atoms can exhibit an optical response based on amplitude, frequency, and/or polarization of the optical beam(s). The optical response of a given atomic system can thus be indicative of a parameter (e.g., time, rotation, magnetic field, electric field, acceleration) to a highly accurate degree. Stability of the power of the optical beam can typically be required to maintain accuracy of the atomic system. The power of the laser that generates the optical beam can be a cause of and subject to different forms of instability, such as caused by environmental fluctuations and aging of the laser, the power supplies, and/or the monitoring systems.

SUMMARY

One example includes an atomic optical reference system. The system includes an optical system comprising a laser configured to generate an optical beam. The system also includes a vapor cell comprising alkali metal atoms that are stimulated in response to a modulated beam corresponding to an amplitude-modulated version of the optical beam. The system also includes a detection system configured to monitor at least one detection signal corresponding to light emitted from or absorbed by the vapor cell and to generate at least one feedback signal in response to the at least one detection signal. The system further includes a beam modulator configured to amplitude-modulate the optical beam to generate the modulated beam and to frequency shift the optical beam to generate an output beam having a stable frequency in response to the at least one feedback signal.

Another example includes a method for generating an output beam having a stable frequency reference. The method includes generating an optical beam and amplitude-modulating the optical beam to generate a modulated beam. The method also includes providing the modulated beam through a vapor cell, the vapor cell comprising alkali metal atoms that are stimulated in response to the modulated beam and monitoring at least one detection signal corresponding to light emitted from or absorbed by the vapor cell. The method further includes generating at least one feedback signal in response to the at least one detection signal, and frequency shifting the optical beam to generate the output beam in response to the at least one feedback signal.

Another example includes an atomic clock system. The atomic clock system includes an optical system comprising a laser configured to generate an optical beam and a vapor cell comprising alkali metal atoms that are stimulated in response to a modulated beam corresponding to an amplitude-modulated version of the optical beam. The system also includes a detection system configured to monitor at least one detection signal corresponding to light emitted from or absorbed by the vapor cell and to generate at least one feedback signal in response to the at least one detection signal. The system also includes an amplitude modulator configured to amplitude-modulate the optical beam between a first amplitude and a second amplitude to generate the modulated beam. The system further includes a frequency shifter that is configured to shift a frequency of the optical beam approximately equal and opposite a frequency shift between the first amplitude and the second amplitude of the modulated beam in response to at least one feedback signal to generate an output beam having a stable frequency.

DETAILED DESCRIPTION

Figure 1:
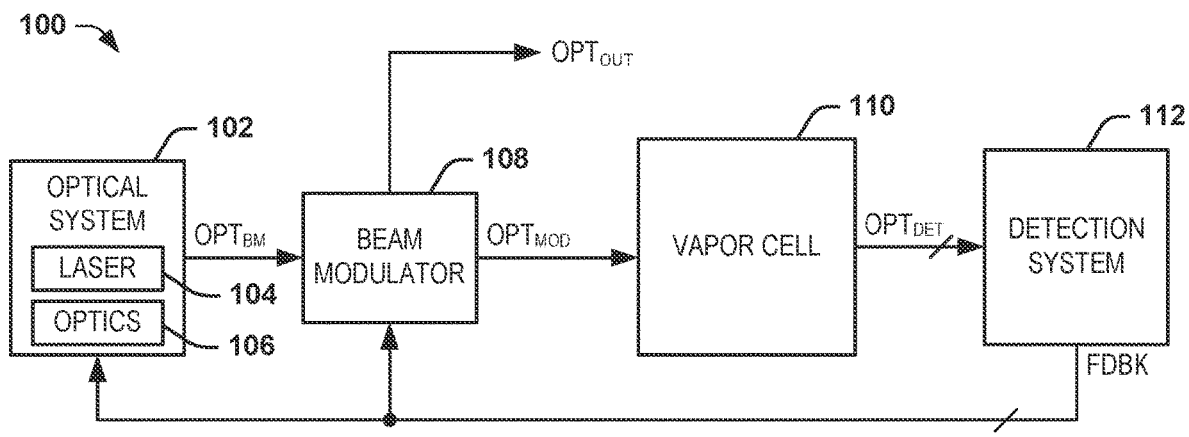
FIG. 1 illustrates an example of an atomic optical reference system.

The present invention relates generally to atomic systems, and specifically to an atomic optical reference system. The atomic optical reference system is configured to generate an output optical beam that has a highly stable frequency that is insensitive to aging and/or other sources of instability. As an example, the output optical beam can be implemented as a frequency reference, such as for an atomic clock.

The atomic optical reference system includes an optical system and a vapor cell. The optical system includes a laser configured to generate an optical beam and the vapor cell includes alkali metal atoms (e.g., cesium). The atoms of the alkali metal vapor can be stimulated (e.g., excited) in response to a modulated beam corresponding to an amplitude-modulated version of the optical beam. As described herein, the terms "amplitude" and "power" with respect to the optical beam are used interchangeably. The optical system can also include optics that can polarize (e.g., circularly-polarize or linearly-polarize) the optical beam and can provide the modulated beam through the vapor cell twice (e.g., in antiparallel directions) to provide a two-photon excitation of the alkali metal vapor atoms based on the frequency of the modulated beam. Therefore, the alkali metal vapor can exhibit fluorescence based on the energy of the alkali metal vapor atoms decaying from an excited state (e.g., from a second energy state to a first energy state).

The atomic optical reference system also includes a detection system configured to monitor at least one detection signal corresponding to light emitted from or absorbed by the vapor cell. The detection signal(s) can include a frequency reference signal corresponding to fluorescence emitted from the alkali metal atoms and can include an amplitude detection beam corresponding to the modulated beam exiting the vapor cell. The detection system can be configured to generate at least one feedback signal in response to the detection signal(s), such as a frequency shift feedback signal based on the frequency reference signal and an amplitude feedback signal based on the amplitude detection beam. The atomic optical reference system further includes a beam modulator configured to amplitude-modulate the optical beam to generate the modulated beam and to frequency shift the optical beam to generate the output beam having a stable frequency in response to the feedback signal(s).

As an example, the beam modulator can modulate the optical beam between a first amplitude and a second amplitude of optical power to generate the modulated beam. As an example, the second amplitude of the optical power can be twice the first amplitude of the optical power. The detection system can include a frequency detector that is configured to monitor the frequency reference signal at each of different times of the first amplitude and the second amplitude of the modulated beam. The detection system can thus generate the frequency shift feedback signal corresponding to the frequency shift of the modulated beam at each of the first and second amplitudes of the modulated beam.

The frequency shift feedback signal can be provided to a frequency shifter that is configured to shift the frequency of the optical beam approximately equal and opposite a frequency shift between the first and second amplitudes of the modulated beam to generate the output beam. As an example, laser power of any amplitude provides light-shift (e.g., AC Stark Shift), and the power of the laser in providing the optical beam can be subject to instability. However, the frequency shift between the first and second amplitudes of the modulated beam can correspond to the frequency shift from the first amplitude of the modulated beam to a zero light-shift based on the locking of the frequency of the optical beam to the frequency corresponding to the maximum probability of stimulation of the alkali metal atoms at the first amplitude of the modulated beam. Accordingly, aging effects and other sources of instability that result in optical frequency shift can be negated from the output beam by continuously measuring and removing the light-induced frequency shift of the optical beam.

FIG. 1 illustrates an example of an atomic optical reference system 100. The atomic optical reference system 100 can be implemented in any of a variety of applications that require a stable frequency of an optical beam. For example, the atomic optical reference system 100 can be implemented in an atomic clock system.

The atomic optical reference system 100 includes an optical system 102. The optical system 102 includes a laser 104 configured to generate an optical beam $OPT_{BM}$ and optics 106. The atomic optical reference system 100 also includes a beam modulator 108. In the example of FIG. 1, the beam modulator 108 is configured to amplitude-modulate the optical beam $OPT_{BM}$ to generate a modulated beam $OPT_{MOD}$. As an example, the amplitude-modulation of the optical beam $OPT_{BM}$ can be between a first amplitude and a second amplitude that is greater than the first amplitude by predetermined amplitude difference. For example, the second amplitude can be approximately twice the first amplitude. As described in greater detail herein, the increase in amplitude of the modulated beam $OPT_{MOD}$ from the first amplitude to the second amplitude results in a frequency shift of the modulated beam $OPT_{MOD}$.

The atomic optical reference system 100 also includes a vapor cell 110 that includes an alkali metal vapor (e.g., cesium). The modulated beam $OPT_{MOD}$ can interact with alkali metal vapor in the vapor cell 110, such as to excite the alkali metal atoms from a first energy state (e.g., ground state) to a second energy state that is greater than the first energy state. As an example, the optics 106 can polarize (e.g., circularly-polarize or linearly-polarize) the optical beam $OPT_{BM}$ and can provide the modulated beam $OPT_{MOD}$ through the vapor cell twice (e.g., in antiparallel directions) to provide a two-photon excitation of the alkali metal atoms in the vapor cell 110 based on the frequency of the modulated beam $OPT_{MOD}$. Therefore, the alkali metal vapor can exhibit fluorescence based on the alkali metal atoms emitting photons to fall back to the initial energy state (e.g., from the second energy state to the first energy state).

The atomic optical reference system 100 further includes a detection system 112. The detection system 112 is configured to monitor at least one detection signal, demonstrated in the example of FIG. 1 as a signal $OPT_{DET}$, that is provided from the vapor cell 110. The detection beam(s) $OPT_{DET}$ can include a power detection beam corresponding to the modulated beam $OPT_{MOD}$ exiting the vapor cell 110, and can include a frequency reference signal corresponding to the fluorescence emitted from the alkali metal atoms. In the example of FIG. 1, the detection system 112 is configured to generate at least one feedback signal FDBK based on the detection beam(s) $OPT_{DET}$. As an example, the feedback signal(s) FDBK can include an amplitude feedback signal and a frequency shift feedback signal. As described in greater detail herein, the amplitude feedback signal can be implemented to lock the amplitude of the modulated beam $OPT_{MOD}$ at each of the first and second amplitudes. As also described in greater detail herein, the frequency shift feedback signal can be implemented to lock the frequency of the optical beam $OPT_{BM}$. For example, the frequency of the optical beam $OPT_{BM}$ can be locked to the frequency that maximizes the probability of stimulation of the alkali metal atoms from the first energy state to the second energy state, thereby resulting in the greatest intensity of fluorescence from the energy of the alkali metal atoms decaying back to the first energy state, at the first amplitude of the modulated beam $OPT_{MOD}$.

Furthermore, the frequency shift feedback signal of the feedback signal(s) FDBK can be provided to the beam modulator 108. The beam modulator 108 can thus shift the frequency of the optical beam $OPT_{BM}$ equal and opposite a frequency shift between the first and second amplitudes of the modulated beam $OPT_{MOD}$ to generate an output beam $OPT_{OUT}$. Therefore, the frequency shift between the first and second amplitudes of the modulated beam can correspond to the frequency shift from the first amplitude of the modulated beam to a zero light-shift, which corresponds to approximately the frequency shift of the optical beam $OPT_{BM}$. Accordingly, aging effects and other sources of instability that result in optical frequency shift can be negated from the output beam by continuously measuring and removing the light-induced frequency shift of the optical beam $OPT_{BM}$.

Figure 2:
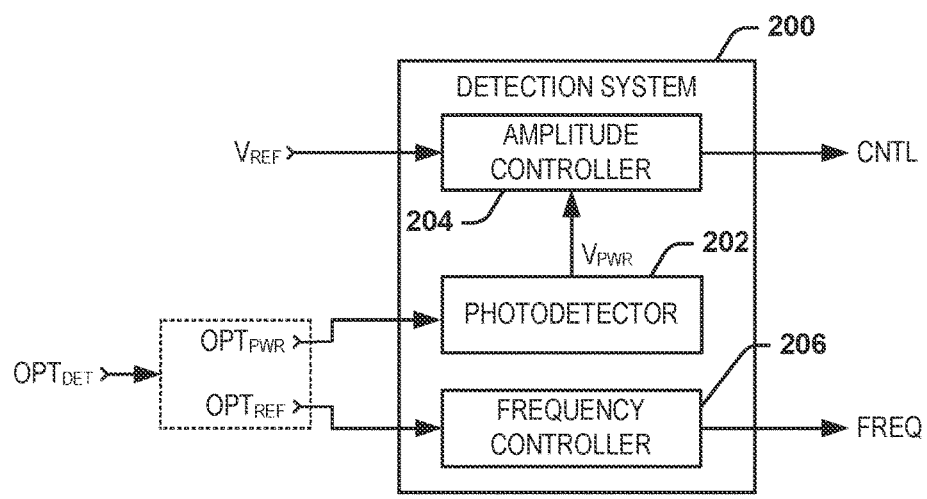
FIG. 2 illustrates an example of a detection system.

FIG. 2 illustrates an example of a detection system 200. The detection system 200 can correspond to the detection system 112 in the example of FIG. 1. Therefore, reference is to be made to the example of FIG. 1 in the following description of the example of FIG. 2.

The detection system 200 includes a photodetector 202 and an amplitude controller 204. The detection system 200 receives the detection signal $OPT_{DET}$, which is demonstrated in the example of FIG. 2 as including a power detection beam $OPT_{PWR}$ and a frequency reference signal $OPT_{REF}$. The power detection beam $OPT_{PWR}$ can correspond to the modulated beam $OPT_{MOD}$ exiting the vapor cell 110 and is provided to the photodetector 202. Therefore, the photodetector 202 is configured to generate a voltage $V_{PWR}$ that is indicative of the amplitude of the power detection beam $OPT_{PWR}$, and thus the modulated beam $OPT_{MOD}$ (e.g., after absorption of photons by the alkali metal atoms in the vapor cell 110). The amplitude controller 204 receives the voltage $V_{PWR}$, as well as a predetermined reference voltage $V_{REF}$. The amplitude controller 204 is thus configured to generate a control signal CNTL that is indicative of a difference between the voltage $V_{PWR}$ and the reference voltage $V_{REF}$.

As described in greater detail herein, the control signal CNTL can be implemented to amplitude-modulate the optical beam $OPT_{BM}$ to generate the modulated beam. For example, the reference voltage $V_{REF}$ can be modulated between a first voltage amplitude corresponding to the first amplitude and a second voltage amplitude corresponding to the second amplitude. Therefore, the control signal CNTL can be indicative of the difference in amplitude of the voltage $V_{PWR}$ relative to the first voltage amplitude of the reference voltage $V_{REF}$ and the second voltage amplitude of the reference voltage $V_{REF}$. Accordingly, the control signal CNTL can correspond to a portion of the feedback signal(s) FDBK that is provided to the beam modulator 108.

The detection system 200 also includes a frequency controller 206. The frequency controller 206 receives the frequency reference signal $OPT_{REF}$ as an input. As an example, the frequency controller 206 can include a photodetector (e.g., a photodiode), and as described above, the frequency reference signal $OPT_{REF}$ can correspond to the fluorescence emitted from the alkali metal atoms as the energy of the alkali metal atoms decays from the second energy state to the first (e.g., ground) energy state, or light absorbed from the optical beam $OPT_{BM}$ by the alkali metal atoms. Therefore, the intensity of the frequency reference signal $OPT_{REF}$ can be indicative of a probability of stimulation of the alkali metal atoms from the first energy state to the second energy state, which is a function of the frequency of the modulated beam $OPT_{MOD}$. Therefore, in response to detecting the intensity of the frequency reference signal $OPT_{REF}$, the frequency controller 206 generates a frequency shift feedback signal FREQ that corresponds to the frequency offset of the modulated beam $OPT_{MOD}$ relative to an optimum peak corresponding to the highest intensity of the frequency reference signal $OPT_{REF}$. The frequency shift feedback signal FREQ can be provided to the laser 104 to lock a frequency of the optical beam $OPT_{BM}$ that corresponds to the highest probability of stimulation of the alkali metal atoms from the first energy state to the second energy state. Additionally, as described in greater detail herein, the frequency shift feedback signal FREQ can be provided to the beam modulator 108 to provide a frequency shift of the optical beam $OPT_{BM}$ to offset the light-shift (e.g., AC Stark shift) resulting from the power of the optical beam $OPT_{BM}$. Accordingly, the frequency shift feedback signal FREQ can correspond to a portion of the feedback signal(s) FDBK that is provided to the beam modulator 108.

Figure 3:
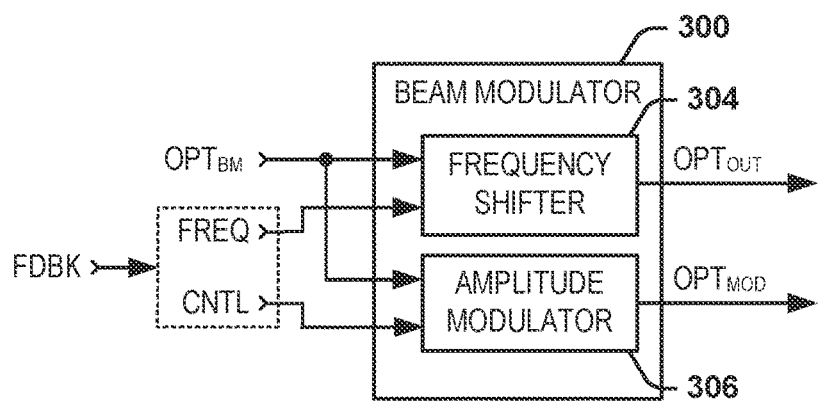
FIG. 3 illustrates an example of a beam modulator.

FIG. 3 illustrates an example of a beam modulator 300. The beam modulator 300 can correspond to the beam modulator 108 in the example of FIG. 1. Therefore, reference is to be made to the example of FIG. 1 in the following description of the example of FIG. 3.

The beam modulator 300 includes an amplitude modulator 302 and a frequency shifter 304. Each of the amplitude modulator 302 and the frequency shifter 304 receive the optical beam $OPT_{BM}$ as an input. The amplitude modulator 302 also receives the control signal CNTL as an input. The amplitude modulator 302 is therefore configured to amplitude-modulate the optical beam $OPT_{BM}$ to generate the modulated beam $OPT_{MOD}$. As an example, the modulated beam $OPT_{MOD}$ can be modulated between a first amplitude that is based on the first voltage amplitude of the reference voltage $V_{REF}$ and a second amplitude that is based on the second voltage amplitude of the reference voltage $V_{REF}$. As another example, the second voltage amplitude of the reference voltage $V_{REF}$ can be approximately twice the amplitude of the first voltage amplitude of the reference voltage $V_{REF}$. Therefore, the second amplitude (e.g., power) of the modulated beam $OPT_{MOD}$ can be approximately twice the amplitude (e.g., power) of the first amplitude of the modulated beam $OPT_{MOD}$.

As described above, the power of the optical beam $OPT_{BM}$, and thus the modulated beam $OPT_{MOD}$, affects the light-shift with respect to absorption of the photons of the modulated beam $OPT_{MOD}$ by the alkali atoms in the vapor cell 110. Therefore, the change in amplitude of the modulated beam $OPT_{MOD}$ can thus result in an observable change in the light-shift of the absorption of photons of the alkali metal atoms between the first amplitude and the second amplitude, as described in greater detail with respect to the example of FIG. 4.

Figure 4:
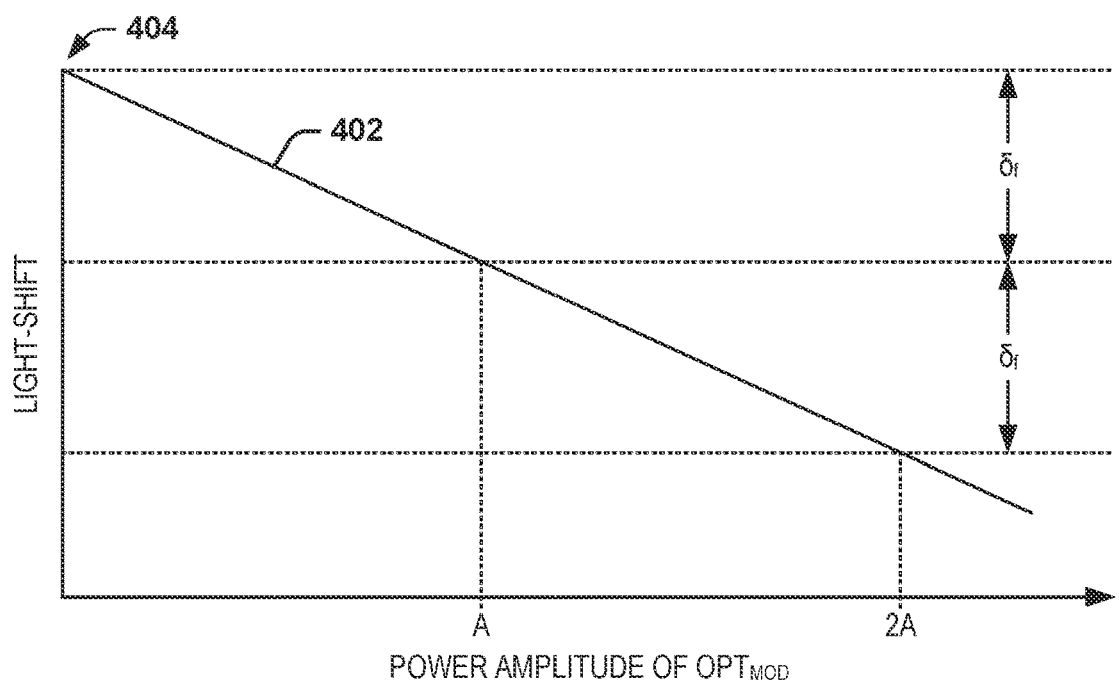
FIG. 4 illustrates an example of a graph of light-shift as a function of optical power.

FIG. 4 illustrates an example of graph 400 of light-shift as a function of optical power. The graph 400 can correspond to the effect of light-shift of the absorption of photons by the alkali metal atoms in the vapor cell 110 resulting from variations in power of the modulated beam $OPT_{MOD}$. Therefore, reference is to be made to the examples of FIGS. 1-3 in the following description of the example of FIG. 4.

The graph 400 includes a line 402 that extends from a zero light-shift point 404 with a negative slope along increasing amplitude of the modulated beam $OPT_{MOD}$. The zero light-shift point 404 corresponds to a point at which optical power is approximately zero, and thus demonstrates that any optical power results in some light-shift, with increasing light-shift at a negative slope (e.g., based on a negative polarity) as optical power further increases. In the example of FIG. 4, the line 402 is demonstrated as approximately linear.

The graph 400 also demonstrates a first power "A" and a second power "2A". For example, the amplitude modulator 306 can be configured to modulate the optical beam between the first power "A" at a first time and the second power "2A" at a second time. As described above, because any power of the modulated beam $OPT_{MOD}$ results in light-shift, the first power "A" is demonstrated as having a frequency shift of $\delta_f$ from the zero light-shift point 404. In the example of FIG. 4, the second power "2A" is demonstrated as having approximately double the power of the first power "A". Therefore, based on the linearity of the line 402, the second power "2A" has a frequency shift of $\delta_f$ from the first power "A", and thus a frequency shift of approximately 2δf from the zero light-shift point 404.

The frequency shift $\delta_f$ can be observable based on the intensity of the frequency reference signal $OPT_{REF}$. For example, based on a known frequency of the excitation of the alkali metal atoms from a first energy state to a second energy state and based on a known spectral density of the intensity of the frequency reference signal $OPT_{REF}$ for on-resonance and detuned frequencies, an offset frequency of the modulated beam $OPT_{MOD}$ can be determined by the frequency controller 206. Therefore, the frequency offset $\delta_f$ can be communicated to the frequency shifter 304 via the frequency shift feedback signal FREQ.

Referring back to the example of FIG. 3, the frequency shifter 304 is configured to receive the frequency shift feedback signal FREQ corresponding to one of the feedback signal(s) FDBK. The frequency shifter 304 can thus provide a frequency shift approximately equal and opposite the frequency offset $\delta_f$ to the optical beam $OPT_{BM}$ to generate the output beam $OPT_{OUT}$. Therefore, the output beam $OPT_{OUT}$ can be provided at a frequency that exhibits approximately zero light-shift, despite sources of instability.

For example, because the difference in light-shift between the first power "A" and the second power "2A" is measured to be approximately equal to the frequency offset $\delta_f$, then because of the linearity of the light-shift with respect to optical power (e.g., as exhibited by the line 402), the difference between the first power "A" and the zero light-shift point 404 is approximately also equal to the frequency offset $\delta_f$. Accordingly, when the laser 104 is locked to the frequency corresponding to the first power "A" of the modulated beam $OPT_{MOD}$, by providing a frequency shift to the optical beam $OPT_{BM}$ that is approximately equal to and opposite the frequency offset $\delta_f$ via the frequency shifter 304, the output beam $OPT_{OUT}$ can be provided at approximately zero light-shift. In other words, light-shift is sampled based on the observable difference between the first and second amplitudes of the modulated beam $OPT_{MOD}$, with such observable light-shift being approximately equal to the light-shift of the optical beam $OPT_{BM}$ when the optical beam $OPT_{BM}$ is locked to the frequency of highest probability of absorption of photons at the first amplitude "A". Accordingly, the measured light-shift can be removed from the optical beam $OPT_{BM}$ to generate the output beam $OPT_{OUT}$ with zero light-shift regardless of sources of instability. As a result, the output beam $OPT_{OUT}$ can be provided at a very stable frequency, and can thus be used as a highly stable frequency reference.

As an example, sources of light-shift instability can result in changes to the slope of the line 402 and/or variation in the applied optical power via the amplitude modulator 302. However, because the frequency offset $\delta_f$ between the first and second powers can be observable and is approximately equal with respect to the frequency offset between the zero light-shift point 404 and the first power, then such sources of instability are irrelevant to canceling the light-shift of the optical beam $OPT_{BM}$ in generating the output beam $OPT_{OUT}$. Furthermore, the example of FIGS. 1-4 herein describe that the amplitude modulation of the optical beam $OPT_{BM}$ in generating the modulating beam $OPT_{MOD}$ is between two powers, with the second power being approximately twice the first power. However, other arrangements can be implemented in the atomic optical reference system 100.

For example, the amplitude-modulation can be between three or more amplitudes that are not limited to being even multiples with respect to each other. As an example, the amplitude modulator 306 can be configured to modulate the optical beam between the first power "A" at a first time, the second power "2A" at a second time, and a third power at a third time. The third power can be either between the first and second powers "A" and "2A" or at a power outside of the range of the first and second powers "A" and "2A". Therefore, non-linearity of the line 402, and thus the light-shift with respect to optical power, can be detected and better modeled to provide for a more accurate observation of power-induced light-shift, and thus a more stable frequency of the output beam $OPT_{OUT}$.

Figure 5:
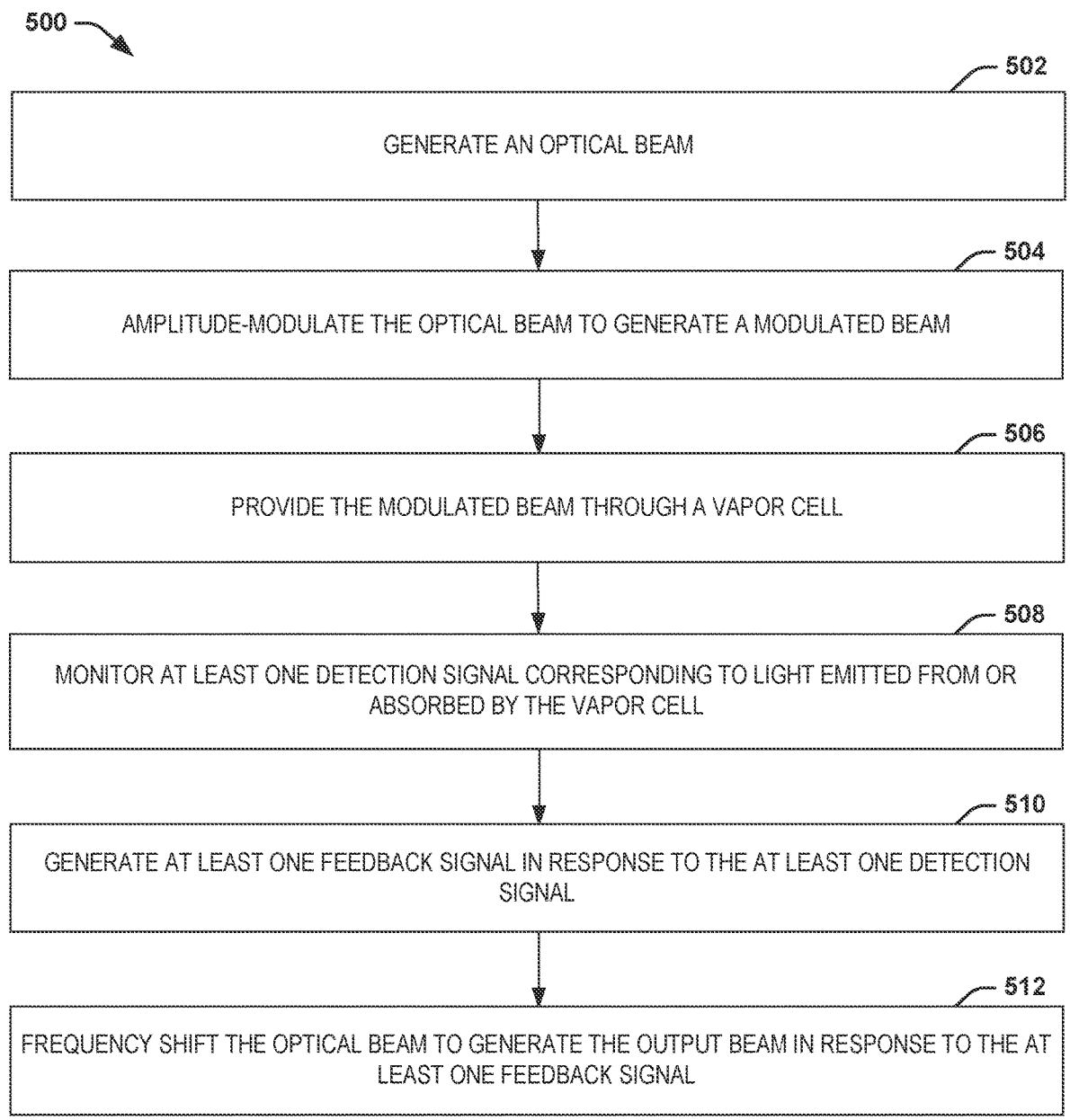
FIG. 5 illustrates an example of a method for generating an output beam having a stable frequency reference.

In view of the foregoing structural and functional features described above, a methodology in accordance with various aspects of the disclosure will be better appreciated with reference to FIG. 5. It is to be understood and appreciated that the method for FIG. 5 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 5 illustrates an example of a method 500 for generating an output beam (e.g., the output beam $OPT_{OUT}$) having a stable frequency reference. At 502, an optical beam (e.g., the optical beam $OPT_{BM}$) is generated. At 504, the optical beam is amplitude-modulated to generate a modulated beam (e.g., the modulated beam $OPT_{MOD}$). At 506, the modulated beam is provided through a vapor cell (e.g., the vapor cell 110). The vapor cell can include alkali metal atoms that are stimulated in response to the modulated beam. At 508, at least one detection signal (e.g., the detection signal(s) $OPT_{DET}$) corresponding to light emitted from or absorbed by the vapor cell is monitored. At 510, at least one feedback signal (e.g., the feedback signal(s) FDBK) is generated in response to the at least one detection signal. At 512, the optical beam is frequency shifted to generate the output beam in response to the at least one feedback signal.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An atomic optical reference system comprising:
    an optical system comprising a laser configured to generate an optical beam;
    a vapor cell comprising alkali metal atoms that are stimulated in response to providing a modulated beam through the vapor cell, the modulated beam corresponding to an amplitude-modulated version of the optical beam;
    a detection system configured to monitor at least one detection signal corresponding to light emitted from or absorbed by the vapor cell and to generate at least one feedback signal in response to the at least one detection signal; and
    a beam modulator configured to amplitude-modulate the optical beam to generate the modulated beam and to frequency shift the optical beam to generate an output beam having a stable frequency in response to the at least one feedback signal, wherein the modulated beam and the output beam are isolated with respect to each other.

2. The system of claim 1, wherein the beam modulator comprises an amplitude modulator configured to amplitude-modulate the optical beam between a first amplitude and a second amplitude to generate the modulated beam.

3. The system of claim 2, wherein the at least one feedback signal comprises an amplitude feedback signal configured to lock the modulated beam to a first predetermined reference amplitude corresponding to the first amplitude at a first time and to a second predetermined reference amplitude corresponding to the second amplitude at a second time, wherein the second amplitude is greater than the first amplitude by a predetermined amplitude difference.

4. The system of claim 2, wherein the amplitude modulator is configured to amplitude-modulate the optical beam between the first amplitude at a first time, the second amplitude, at a second time, and a third amplitude at a third time to generate the modulated beam.

5. The system of claim 2, wherein the at least one feedback signal comprises a frequency shift feedback signal, wherein the beam modulator comprises a frequency shifter that is configured to shift a frequency of the optical beam approximately equal and opposite a frequency shift between the first and second amplitudes of the modulated beam to generate the output beam.

6. The system of claim 1, wherein the optical system comprises optics configured provide the modulated beam through the vapor cell twice to provide for absorption of two photons to excite the alkali metal atoms from a first energy state to a second energy state, wherein the at least one detection signal comprises a frequency reference signal corresponding to fluorescence emitted from the alkali metal atoms in response to energy of the alkali metal atoms decaying from the second energy state to the first energy state.

7. The system of claim 6, wherein the detection system is configured to monitor the frequency reference signal, wherein the at least one feedback signal comprises a frequency feedback signal corresponding to a frequency of the optical beam, wherein the frequency feedback signal is configured to lock the frequency of the optical beam to a predetermined frequency.

8. The system of claim 7, wherein the beam modulator comprises a frequency shifter that is configured to shift the frequency of the optical beam approximately equal and opposite a frequency shift between a first amplitude and a second amplitude of the modulated beam in response to the frequency feedback signal to generate the output beam.

9. The system of claim 6, wherein the at least one detection signal comprises an amplitude detection beam corresponding to the modulated beam exiting the vapor cell, wherein the detection system comprises a photodetector configured to monitor an amplitude of the amplitude detection beam to lock a first amplitude of the modulated beam to a predetermined amplitude, the beam modulator being configured to modulate the modulated beam between the first amplitude and a second amplitude that is greater than the first amplitude by a predetermined amplitude difference.

10. An atomic clock comprising the atomic optical reference system of claim 1, wherein the atomic clock is configured to provide a time reference based on the output beam.

11. A method for generating an output beam having a stable frequency reference, the method comprising:
generating an optical beam;
amplitude-modulating the optical beam to generate a modulated beam;
providing the modulated beam through a vapor cell, the vapor cell comprising alkali metal atoms that are stimulated in response to the modulated beam provided through the vapor cell;
monitoring at least one detection signal corresponding to light emitted from or absorbed by the vapor cell;
generating at least one feedback signal in response to the at least one detection signal; and
frequency shifting the optical beam to generate the output beam in response to the at least one feedback signal, wherein the modulated beam and the output beam are isolated with respect to each other.

12. The method of claim 11, wherein amplitude-modulating the optical beam comprises amplitude-modulating the optical beam between a first amplitude at a first time and a second amplitude at a second time to generate the modulated beam.

13. The method of claim 12, wherein generating at least one feedback signal comprises generating a frequency shift feedback signal, wherein frequency shifting the optical beam comprises shifting a frequency of the optical beam approximately equal and opposite a frequency shift between the first and second amplitudes of the modulated beam to generate the output beam.

14. The method of claim 11, wherein providing the modulated beam through the vapor cell comprises exciting the alkali metal atoms from a first energy state to a second energy state in response to the modulated beam, wherein monitoring at least one detection signal comprises monitoring a frequency reference signal corresponding to fluorescence emitted from the alkali metal atoms in response to energy of the alkali metal atoms decaying from the second energy state to the first energy state, wherein generating the at least one feedback signal comprises generating a frequency feedback signal corresponding to a frequency of the optical beam, wherein the frequency feedback signal is configured to lock the frequency of the optical beam to a predetermined frequency, the method further comprising shifting the frequency of the optical beam approximately equal and opposite a frequency shift between a first amplitude and a second amplitude of the modulated beam in response to the frequency feedback signal to generate the output beam.

15. The method of claim 11, wherein monitoring at least one detection signal comprises monitoring an amplitude detection beam corresponding to the modulated beam exiting the vapor cell via a photodetector to lock a first amplitude of the modulated beam to a predetermined amplitude, wherein modulating the optical beam comprises modulating the modulated beam between the first amplitude and a second amplitude that is greater than the first amplitude by a predetermined amplitude difference.

16. An atomic clock system, the atomic clock system comprising:
an optical system comprising a laser configured to generate an optical beam;
a vapor cell comprising alkali metal atoms that are stimulated in response to providing a modulated beam through the vapor cell, the modulated beam corresponding to an amplitude-modulated version of the optical beam;
a detection system configured to monitor at least one detection signal corresponding to light emitted from or absorbed by the vapor cell and to generate at least one feedback signal in response to the at least one detection signal;
an amplitude modulator configured to amplitude-modulate the optical beam between a first amplitude and a second amplitude to generate the modulated beam; and
a frequency shifter that is configured to shift a frequency of the optical beam approximately equal and opposite a frequency shift between the first amplitude and the second amplitude of the modulated beam in response to at least one feedback signal to generate an output beam having a stable frequency, wherein the modulated beam and the output beam are isolated with respect to each other.

17. The system of claim 16, wherein the optical system comprises optics configured provide the modulated beam through the vapor cell twice to provide for absorption of two photons to excite the alkali metal atoms from a first energy state to a second energy state, wherein the at least one detection signal comprises a frequency reference signal corresponding to fluorescence emitted from the alkali metal atoms in response to energy of the alkali metal atoms decaying from the second energy state to the first energy state.

18. The system of claim 17, wherein the detection system is configured to monitor the frequency reference signal, wherein the at least one feedback signal comprises a frequency feedback signal corresponding to the frequency of the optical beam, wherein the frequency feedback signal is configured to lock the frequency of the optical beam to a predetermined frequency.

19. The system of claim 18, wherein the at least one detection signal comprises an amplitude detection beam corresponding to the modulated beam exiting the vapor cell, wherein the detection system comprises a photodetector configured to monitor an amplitude of the amplitude detection beam to lock the first amplitude of the modulated beam to a predetermined amplitude, the beam modulator being configured to modulate the modulated beam between the first amplitude and the second amplitude that is greater than the first amplitude by a predetermined amplitude difference.

20. The system of claim 16, wherein the amplitude modulator is configured to amplitude-modulate the optical beam between the first amplitude at a first time, the second amplitude, at a second time, and a third amplitude at a third time to generate the modulated beam.

* * * * *